United States Patent

[11] 3,582,799

[72] Inventor Terence Patrick Reid
Rochester, N.Y.
[21] Appl. No. 863,003
[22] Filed Aug. 25, 1969
[45] Patented June 1, 1971
[73] Assignee General Dynamics Corporation

[54] DISCRIMINATOR CIRCUIT OF THE CHARGE TRANSFER TYPE
9 Claims, 2 Drawing Figs.

[52] U.S. Cl. .......... 329/103, 307/233, 307/246, 328/67, 328/151, 329/126
[51] Int. Cl. .......... H03d 3/04
[50] Field of Search .......... 329/102, 103, 126; 307/246, 233, 232, 255, 313, 288; 328/67, 151

[56] References Cited
UNITED STATES PATENTS
3,188,495 6/1965 Grimm .......... 307/246X
3,506,848 4/1970 Beurrier .......... 307/246X
OTHER REFERENCES
Clapper " Slope Discriminator" IBM Technical Disclosure Bulletin Vol. 3, No. 9, p. 30, Feb. 1961 307— 313

*Primary Examiner*—Alfred L. Brody
*Attorney*—Martin Lukacher

ABSTRACT: An FM signal discriminator circuit is described having a pair of emitter follower transistors of complementary symmetry cross coupled to each other. The output is taken at a base to emitter junction of one of the transistors so that voltage drops across the base to emitter junctions cancel, thereby enhancing linearity and temperature stability of the circuit. Discriminating action is obtained by transfer of charge between capacitors, one of which is contained in a charging circuit connected between the cross coupled transistors. The voltage across the last-mentioned capacitor is a function of the frequency of an input signal.

Figure 1:
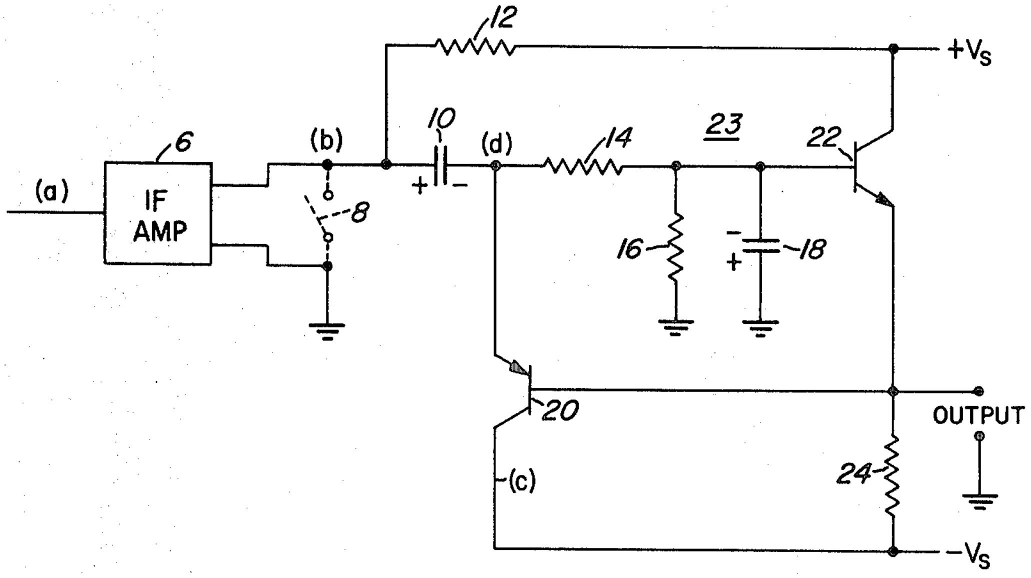

INVENTOR.
TERENCE P. REID

BY

HIS ATTORNEY

DISCRIMINATOR CIRCUIT OF THE CHARGE TRANSFER TYPE

The present invention relates to discriminator circuits and particularly to a frequency discriminator circuit of the integrating type.

The invention is especially suitable for use in FM receivers wherein the received signal is converted to a relatively low frequency, say 1 MHz. prior to application to the discriminator circuit. Features of the invention, however, are applicable generally to discriminator circuits of the integrating type (viz where samples of the input signal voltage obtained each cycle are integrated to provide an output which is a function of the frequency of the input signal).

Although discriminator circuits having RC circuits are desirable because of their simplicity and low cost, such circuits have been limited in their use to applications involving temperature-controlled environments. These limitations have arisen out of the temperature sensitivity of the RC components, as well as the active elements of the circuit. It will be appreciated that conventional means for temperature compensation are not directly applicable to discriminator circuits of the integrating type, since the temperature compensating elements themselves introduce nonlinearities which degrade circuit performance with temperature.

Accordingly, it is an object of the present invention to provide an improved discriminator circuit.

It is a still further object of the present invention to provide an improved discriminator circuit of the integrating type having low output impedance which makes it especially useful for driving filters and output amplifier stages of the transistor type.

It is a still further object of the present invention to provide an improved discriminating circuit of the integrating type which is adaptable to have wide dynamic range.

Briefly described, a discriminator circuit embodying the invention includes a pair of active circuit elements, such as complementary-type transistors which are cross coupled to each other. In the cross coupling between the emitter and base of different ones of these transistors, there is disposed an integrating circuit. An input circuit including a capacitor applies an input signal, say the limited (square wave) output of an FM IF amplifier to the integrating circuit. Charge in therefore accumulated on the input circuit capacitor and transferred to the integrating circuit capacitor once during each cycle. The cross coupled transistors provide cancellation of any nonlinear effects while controlling the charge transfer, between the input circuit capacitor and the integrating circuit capacitor, and in addition, provide good linearity in that the voltage accumulation during each cycle of the input signal is constant. The dynamic range of the circuit may be varied simply by changing the operating voltages.

Figure 2:
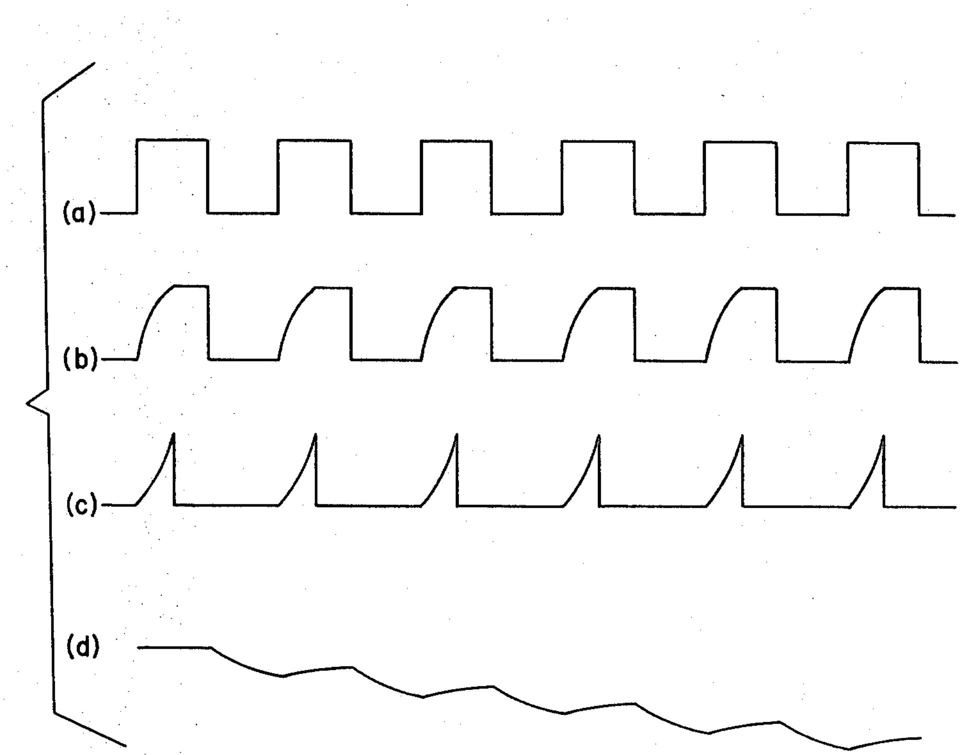

The invention itself, both as to its organization and method of operation, as well as additional objects and advantages thereof will become more readily apparent from a reading of the following description in connection with the accompanying drawings in which:

FIG. 1 is a schematic diagram of a discriminator circuit embodying the invention; and FIG. 2 is a diagram of waveforms generated in or applied to the circuit of FIG. 1.

The input signal to the discriminator may be obtained from the IF amplifier 6 of an FM receiver. Accordingly, the IF amplifier input is a square wave at the IF frequency. This signal is shown by way of illustration in waveform (*a*), FIG. 2. The signal is essentially a square wave, and thus the output of the IF amplifier may be considered to be at a positive potential (viz the potential of the operating signal source $V_s$ for one-half cycle, and then at ground potential for the remainder of the cycle). Accordingly, the input signal may be considered to have been produced by closures of a switch 8 at the input signal frequency. The resistor 12 which is connected from the operating voltage source at $+V_s$ may be part of the IF amplifier (viz the collector resistor of the output stage thereof).

Consider the portion of the cycle when the switch 8 is open (viz the first half period of each cycle of the input signal). An input circuit capacitor 10 is then charged to the polarities indicated in the drawing by voltage from the source $+V_s$. The charging current path for the capacitor 10 is through the resistor 12, the capacitor 10 and the emitter to collector path of PNP transistor 20. The discriminator circuit includes two active elements; namely, the transistor 20 and another transistor of the NPN type 22. These elements have control and output terminals or electrodes which are provided by the base emitter and collector thereof.

The transistors 20 and 22 are basically emitter follower circuits, and are exemplary of any of these terminal (control, input and output terminal) active elements where the signal at the input to the terminal follows the signal at the control terminal (viz an input follower), the transistor 22 having an output resistor 24 connected to the emitter thereof at which the audiofrequency output may be derived. The transistors are cross coupled to each other; the emitter of the transistor 22 being connected to the base of the transistor 20 and the emitter of the transistor 20 being connected to the base of the transistor 22 via the integrating circuit 23. The integrating circuit 23 includes a pair of resistors 14 and 16, the resistor 14 being a series resistor in the path from the emitter of the transistor 20 to the base of the transistor 22. The resistor 16 and the capacitor 18 are both connected between the base of the transistor 22 and the source of reference potential such as ground.

In order to insure linear operation, an equal or constant voltage must be transferred during each cycle of the input signal from the capacitor 10 in the input circuit to the capacitor 18 in the integrating circuit 23.

The discriminator circuit shown in FIG. 1 provides this feature in the following manner. By virtue of the fact that both of the transistors 20 and 22 are emitter followers, the base of the transistor 20 will be negative with respect to its emitter by the voltage drop ($-V_{be\,22}$) of the transistor 22. The transistor 20 will then be conductive and pass a spike of current, as shown in waveform *c* through the charging circuit including the resistor 12, the capacitor 10 and the emitter to collector path of the transistor 22 which has a changing time constant which is much less than half the period of the signal. Accordingly, the capacitor 10 initially charges to the source potential $+V_s$. A charging time constant as indicated by the voltage across the capacitor measured between the ground and the plate thereof connected to the IF amplifier is indicated in waveform *b*. It will be noted that once the capacitor 10 charges, the emitter of the transistor 20 becomes more negative than its base and the transistor 20 cuts off. At the end of the first half period of each cycle, the switch 8 effectively closes which provides a discharging path for the capacitor 10 through the resistor 14 of the capacitor 10. Charge will then be transferred from the capacitor 10 to the capacitor 18. The voltage developed across the capacitor 18 is a function of the values of the resistors 14 and 16 which create a voltage divider. Desirably, the resistor 14 has a resistance much less than the resistance of the resistor 16. Accordingly, substantially the entire voltage across the capacitor 10 is transferred during the second half of each period of the input signal. The cross coupled transistors 20 and 22 insure linearity by virtue of the fact that on the next cycle of the input signal, the voltage across the integrating circuit capacitor 18 appears at both the base and emitter of the transistors and insures that the voltage drop from base to emitter of each transistor will always be equal and will cancel, thereby compensating for any temperature effects or nonlinearities in the circuit. The charging of the integrating circuit capacitor 18 continues during each cycle. A portion of the charge of the integrating circuit capacitor 18 leaks through the resistor 16 during each cycle. Accordingly, the voltage across the capacitor 18 will reach a steady state proportional to the frequency of the input signal. The gradual increase of the voltage across the capacitor 18 is illustrated in waveform *d*. While waveform *d* illustrates the waveform at the emitter of the transistor 20, it will be appreciated that, by virtue of the effect that the magnitude of the resistor 16 is much greater than the magnitude of the resistor 14, the voltage across the capacitor 18 will closely follow but be of slightly smaller amplitude than the voltage at the emitter 20. Also, there will be a slight delay in the voltage across the capacitor 18 by virtue of the phase shift effect in the RC integrating circuit 23.

The output voltage at the emitter of the transistor 22, by virtue of its emitter following action, will be identical to the voltage across the capacitor 18.

The dynamic range of the discriminator circuit is a function of the magnitude of the operating voltages $+V_s$ and $-V_s$. These voltages may be increased or decreased in order to either increase or decrease the dynamic range, as required.

As solely by way of example, the constituents of a discriminator circuit, as illustrated in FIG. 1, which is designed to operate at an input signal center frequency of 1 MHz. are as follows:

Transistor 20 is a 2N2907; transistor 22 is a 2N2222; capacitor 10 has a capacitance of 56 pf.; capacitor 18 has a capacitance of 390 pf.; resistors 12, 14, 16 and 24 are respectively 650, 820, 8200 and 3900 ohms; and $V_s$ is 6 volts.

From the foregoing description, it will be apparent that there has been provided improved discriminator circuits. While specific values of circuit elements and a mode of operation which the illustrated circuit is thought to have been depicted and described, it will be appreciated that this has been done for purposes of illustration and that variations and modifications of the herein described circuit and circuit elements, as well as the mode of operation thereof, may become apparent to those skilled in the art. Accordingly, the foregoing description should be taken merely as illustrative and not in any limiting sense.

What I claim is:

1. A discriminator circuit which comprises a. a first and a second active circuit element, each having input, output and control terminals, b. said second element being connected as an input follower and having an output resistor connected to its input terminal across which output resistor the output voltage of said discriminator circuit is obtainable, c. means for interconnecting said first and second elements in cross coupled relationship with said control terminal of said first element connected to said second element input terminal and said first element input terminal connected to said second element control terminal, d. said connection between said first element input terminal and said second element control terminal including a first resistor connected in series therebetween, a first capacitor connected between the junction of said first resistor and second element control terminal and a point of reference potential, and a second resistor connected between said last-named junction and said reference potential point, and e. input signal operated means including a second capacitor connected to said first element input terminal for applying voltages to the circuit elements in said connection between said first element input terminal and said second element control terminal as a function of said input signal.

2. The invention as set forth in claim 1 wherein said second resistor has a value of resistance much greater than said first resistor.

3. The invention as set forth in claim 2 wherein the time constant of a circuit including said second capacitor and said first element input to output terminal path is much less than half the period of said input signal.

4. The invention as set forth in claim 3 wherein the time constant of the circuit including said first and second capacitors and said first and second resistors is much more than the period of said input signal.

5. The invention as set forth in claim 4 including an input signal source which is a square wave having a potential equal to said reference potential during alternate half cycles thereof.

6. The invention as set forth in claim 5 wherein said first and second elements are first and second transistors having base electrodes which provide said control terminals, emitter electrodes which provide said input terminals and collector electrodes which provide said output terminals.

7. The invention as set forth in claim 6 wherein said first and second transistors are of complementary types.

8. The invention as set forth in claim 7 wherein said first transistor is of PNP type and said second transistor is of NPN type.

9. The invention as set forth in claim 8 wherein said collector electrodes of said first and second transistors are respectively connected to source of operating voltage which are negative and positive with respect to said reference potential.